(12) United States Patent
Yoon

(10) Patent No.: US 7,548,106 B2
(45) Date of Patent: Jun. 16, 2009

(54) INTERNAL READ SIGNAL GENERATOR AND SEMICONDUCTOR MEMORY DEVICE HAVING THE SAME

(75) Inventor: Sang-Sic Yoon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 33 days.

(21) Appl. No.: 11/647,646

(22) Filed: Dec. 29, 2006

(65) Prior Publication Data

US 2008/0042718 A1    Feb. 21, 2008

(30) Foreign Application Priority Data

Jun. 29, 2006    (KR) .................... 10-2006-0059253

(51) Int. Cl.
*G06F 1/04*    (2006.01)
(52) U.S. Cl. .................. 327/291; 327/292; 327/293
(58) Field of Classification Search ................ 327/141, 327/165, 166, 291, 292, 298, 299, 293
See application file for complete search history.

(56) References Cited

U.S. PATENT DOCUMENTS

| | | | | |
|---|---|---|---|---|
| 4,821,295 | A * | 4/1989 | Sanner | ................... 375/360 |
| 5,557,623 | A * | 9/1996 | Discoll | ................... 714/814 |
| 6,509,762 | B1 * | 1/2003 | Moss et al. | ................... 327/12 |
| 6,801,074 | B2 * | 10/2004 | Meguro | ................... 327/298 |
| 6,987,705 | B2 | 1/2006 | Kim et al. | |
| 7,084,679 | B2 * | 8/2006 | Hartfiel et al. | ............... 327/141 |
| 7,098,706 | B1 * | 8/2006 | Pasqualini | ................... 327/141 |

FOREIGN PATENT DOCUMENTS

| | | |
|---|---|---|
| JP | 2004-246958 | 9/2004 |
| KR | 2003-0046133 | 6/2003 |
| KR | 10-2005-0121524 A | 12/2005 |

* cited by examiner

*Primary Examiner*—An T Luu
(74) *Attorney, Agent, or Firm*—Blakely, Sokoloff, Taylor & Zafman

(57) ABSTRACT

The internal read signal generator according to the present invention includes: a first delay unit for delaying a clock signal in order to obtain a margin of a setup/hold time of an input signal; a signal transfer unit for transferring the input signal in synchronization with the delayed clock signal of the first delay unit; a second delay unit for delaying an output signal of the signal transfer unit; and an output unit for combining the input signal and an output signal of the second delay unit, wherein an amount of the delay of the second delay unit is determined in order that a rising edge of an output signal of the output unit has a period of the clock signal.

9 Claims, 6 Drawing Sheets

INTERNAL READ SIGNAL GENERATOR AND SEMICONDUCTOR MEMORY DEVICE HAVING THE SAME

CROSS-REFERENCE TO RELATED APPLICATION

The present invention claims priority of Korean patent application number 10-2006-0059253, filed on Jun. 29, 2006, which is incorporated by reference in its entirety.

BACKGROUND OF THE INVENTION

The present invention relates to a semiconductor design technology; and more particularly, to an internal read signal generator capable of obtaining the margin of setup/hold time of an input signal and a semiconductor memory device having the same.

An internal read signal generated by an external read command is produced in synchronization with a rising of a clock signal. This internal read signal transfers the corresponding read data to an external circuit through an output buffer.

An operation of this internal read signal is changed based on a burst length control of a semiconductor memory device. For example, only the internal read signal which is first generated by a read command is used when the burst length is 4. However, if the burst length is 8, a new internal read signal having further one period of time of the first internal signal is needed. Here, the burst length, as a characteristic of the operations in the synchronous memory device, means the number of successively outputted data when one address signal is inputted.

FIG. 1 is a block diagram illustrating an internal read signal generating circuit for burst length <8>. Referring to FIG. 1, an internal read signal (casprd6d) generating circuit includes two flip-flop circuits (DFFA and DFFB) 101 and 102, a delay circuit (DELAY1) 103 and an output unit 104. More concretely, the internal read signal generating circuit includes: a first inverter INV1 to invert a read CAS (column address strobe) source signal casprd6; a first flip-flop circuit 101 to deliver an output signal of the first inverter (an inverted read CAS source signal casprd6b) in response to the control of CAS clock signal casp4; a second flip-flop circuit 102 to transfer a first output signal DFFAOUTsig of the first flip-flop circuit 101 in response to the control of CAS clock signal casp4; a delay circuit 103 to delay a second output signal DFFBOUTsig of the second flip-flop circuit 102, and a first NAND gate NAND1 of the output unit 104 receiving the output signal of the delay circuit 103 and the inverted read CAS source signal casprd6b from the first inverter INV1.

FIGS. 2a and 2b are timing diagrams of the internal read signal generating circuit of FIG. 1. Referring to FIG. 2, read data RD are read out from a memory in synchronization with a clock signal clk and the read CAS source signal casprd6 is then activated. The first flip-flop 101 delivers the inverted read CAS source signal casprd6b in response to the CAS clock signal casp4, as a control signal, which it produces by delaying a clock signal for a predetermined time. At this time, there is a fixed delay time difference (dt) between the CAS clock signal casp4 and the inverted read CAS source signal casprd6b based on a rising edge of a specific clock signal clk.

The inverted read CAS source signal casprd6b is latched in the first flip-flop circuit 101 at the second rising edge (r1) of the CAS clock signal casp4 so that the inverted read CAS source signal casprd6b which is shifted by a period of one clock signal clk is outputted as the first output signal DFFAOUTsig. Likewise, the second flip-flop circuit 102 shifts the first output signal DFFAOUTsig by a period of one clock signal clk and outputs the shifted signal as the second output signal DFFBOUTsig. Further, the delay circuit 103 adjusts a matching delay value in order that the time difference between the first output signal DFFAOUTsig and the second output signal DFFBOUTsig is 2*tck (tck: a period of clock signal). As a result, the internal read signal casprd6d having burst length <8> is produced.

However, as the operating frequency of the semiconductor memory device gradually moves to a high frequency band, the malfunction of the semiconductor memory device is often caused. Referring to FIG. 2b, when the delay time difference (dt) is greater than a period of time (tck) of the clock signal clk, the first output signal DFFAOUTsig is not produced at the second rising edge (r1) of the CAS clock signal casp4, but produced at the third rising edge (r2). Therefore, the first output signal DFFAOUTsig is not produced and the final output signal, the internal read signal casprd6d, is not normally generated.

As a result, the internal read signal generating circuit of FIG. 1 operated only at the low frequency in which the period of time (tck) of the clock signal clk is bigger than the delay time difference (dt). This acts contrary to the high frequency operation of the semiconductor memory device. Furthermore, the malfunction generated by this kind of the delay time difference (dt) is not limited to the internal read signal generating circuit and it can be generated in other signal generation circuits in which the delay time difference (dt) can be generated.

SUMMARY OF THE INVENTION

Embodiments of the present invention are directed to provide a semiconductor device having capable of guaranteeing the margin of setup/hold time of an input signal in high frequency environment.

In accordance with an aspect of the present invention, there is provided a semiconductor memory device comprising: a first delay means for delaying a clock signal in order to obtain a margin of a setup/hold time of an input signal; a signal transfer means for transferring the input signal in synchronization with the delayed clock signal of the first delay means; a second delay means for delaying an output signal of the signal transfer means; and an output means for combining the input signal and an output signal of the second delay means, wherein an amount of the delay of the second delay means is determined in order that a rising edge of an output signal of the output means has a period of the clock signal.

In accordance with another aspect of the present invention, there is provided an apparatus for generating an internal read signal comprising: a first delay means for delaying an internal clock signal in order to obtain a margin of a setup/hold time of an internal read signal; a flip-flop unit to transfer the internal read signal in synchronization with the delayed clock signal of the first delay means; a second delay means for delaying an output signal of the flip-flop unit; and an output means for combining the internal read signal and an output signal of the second delay means, wherein an amount of delay of the second delay means is determined in order that a rising edge of an output signal of the output means has a period of the internal clock signal.

In accordance with a further another aspect of the present invention, there is provided a semiconductor memory device comprising: a first delay means for delaying a clock signal in order to obtain a margin of a setup/hold time of an input signal; a signal transfer means for transferring the input signal in synchronization with the delayed clock signal of the first delay means; and a second delay means for delaying an output signal of the signal transfer means.

DESCRIPTION OF SPECIFIC EMBODIMENTS

An object to the present invention is to provide a semiconductor device capable of obtaining the margin of setup/hold time of an input signal in high frequency environment.

Anther object of the present invention is to provide an internal read signal generator capable of obtaining the margin of setup/hold time of an internal read signal in high frequency environment.

The present invention secures the margin of the setup/hold time of the input signal in the high frequency environment and then prevents the malfunction of the internal read signal generator for the burst length <8> the internal read signal production. Accordingly, the present invention has an effect on the reliability with the stability in the high speed operation of the semiconductor memory device.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 1:
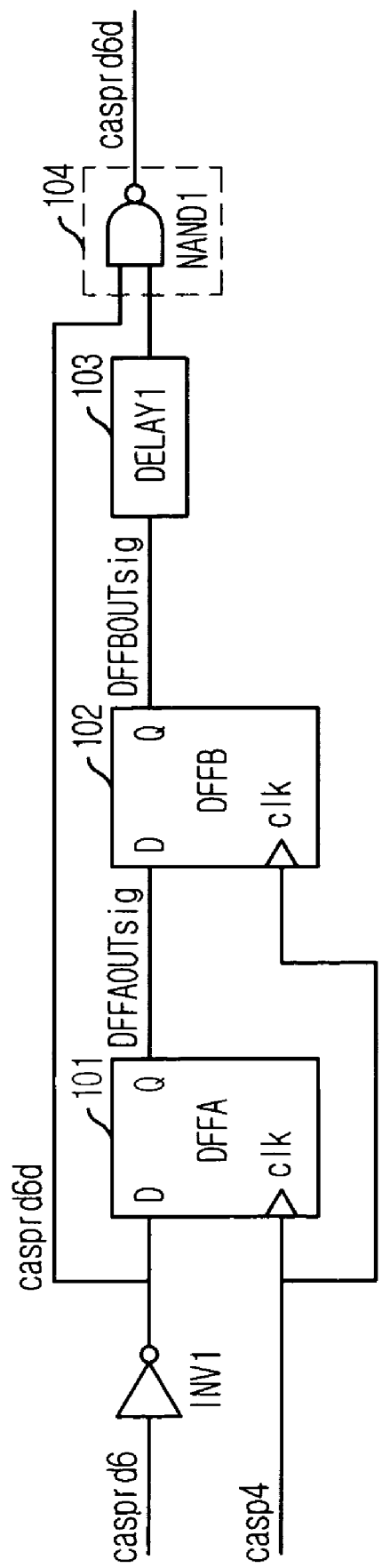
FIG. 1 is a block diagram illustrating an internal read signal generating circuit for burst length <8>.
Figure 2A:
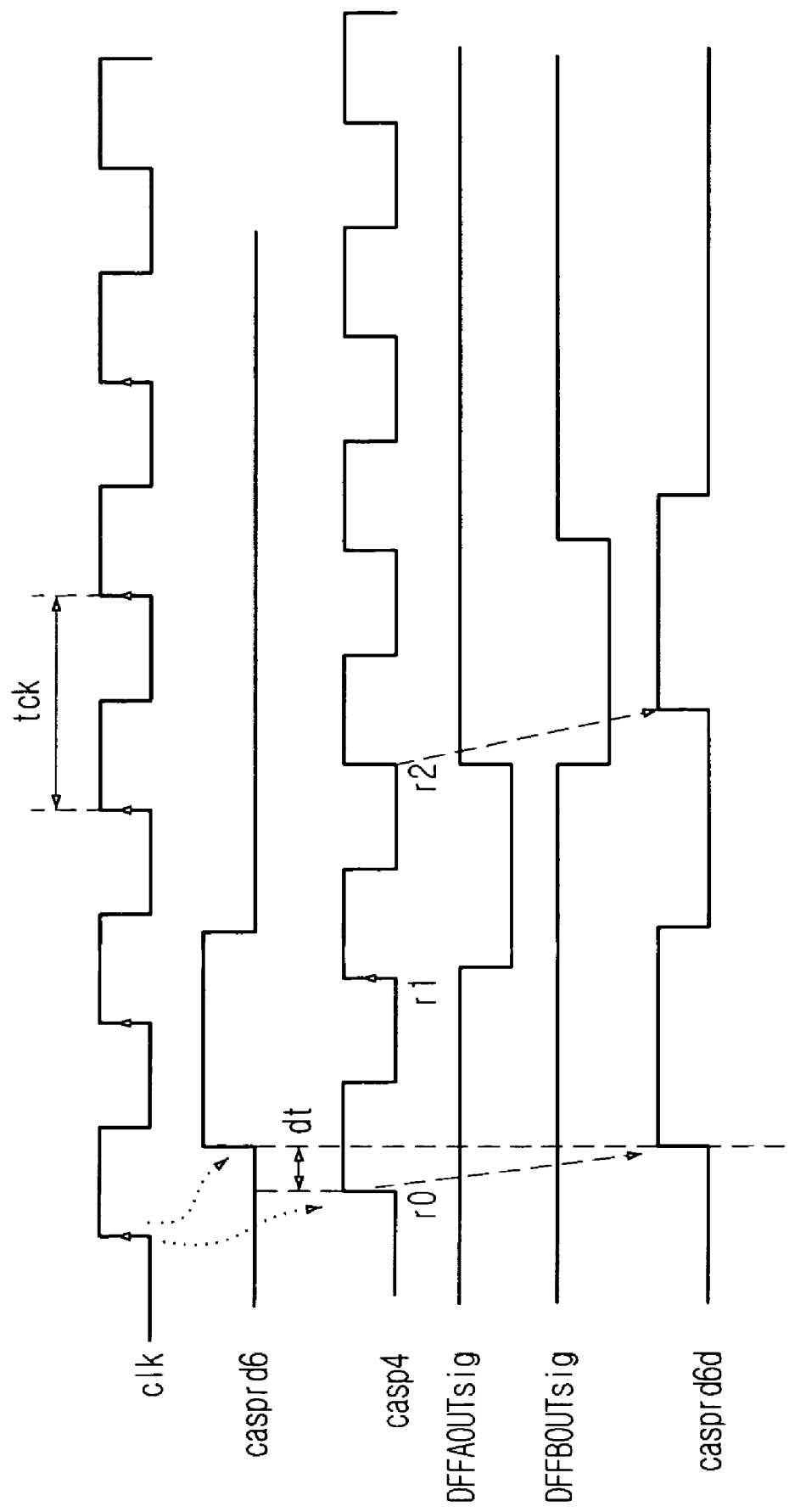
FIGS. 2a and 2b are timing diagrams of the internal read signal generating circuit of FIG. 1.
Figure 2B:
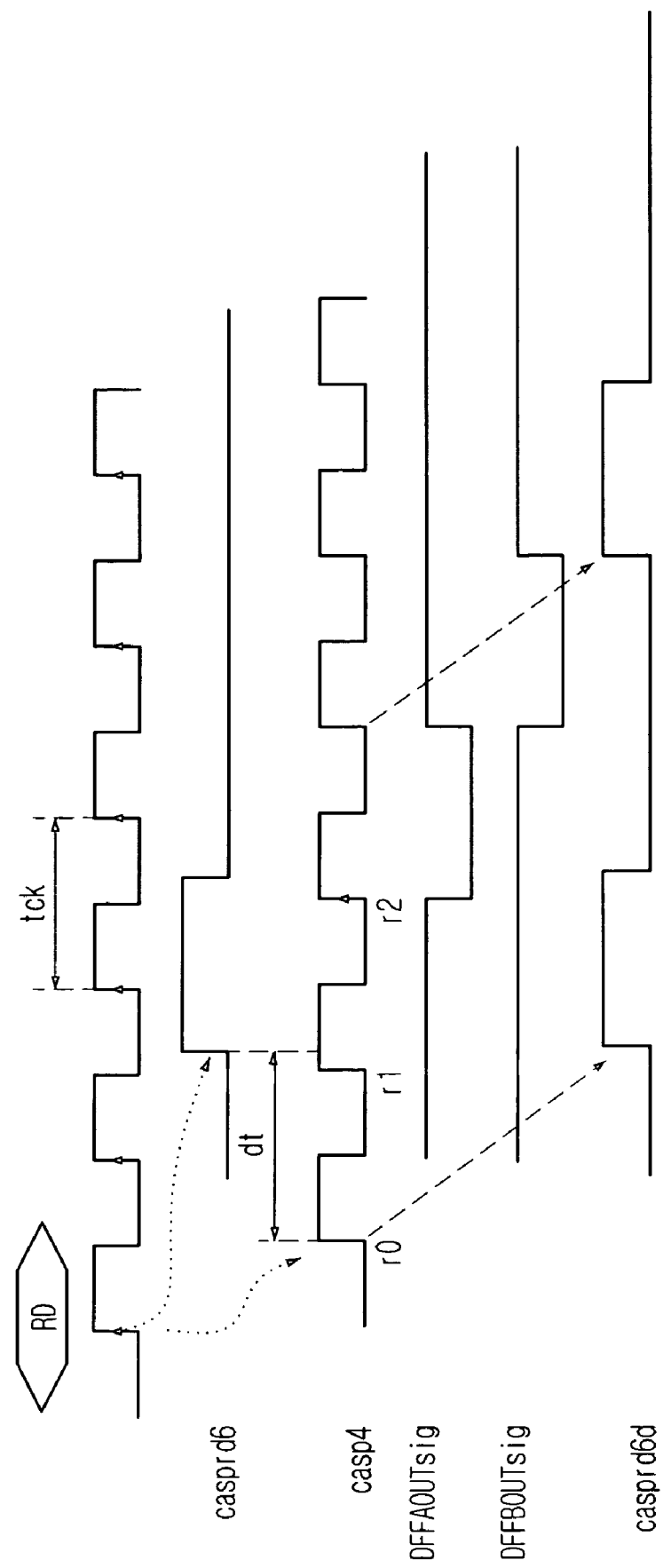
Figure 3A:
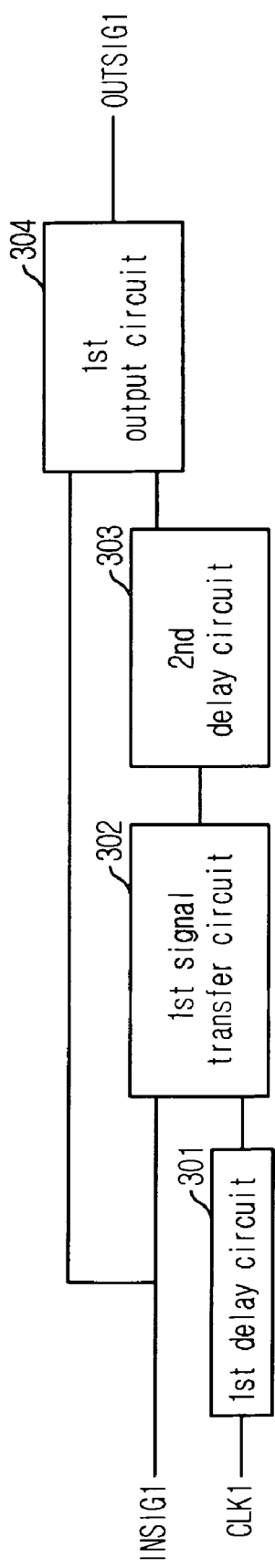
FIGS. 3a and 3b are block diagrams illustrating a signal generating circuit for obtaining a margin of setup/hold time according to an embodiment of the present invention.
Figure 3B:
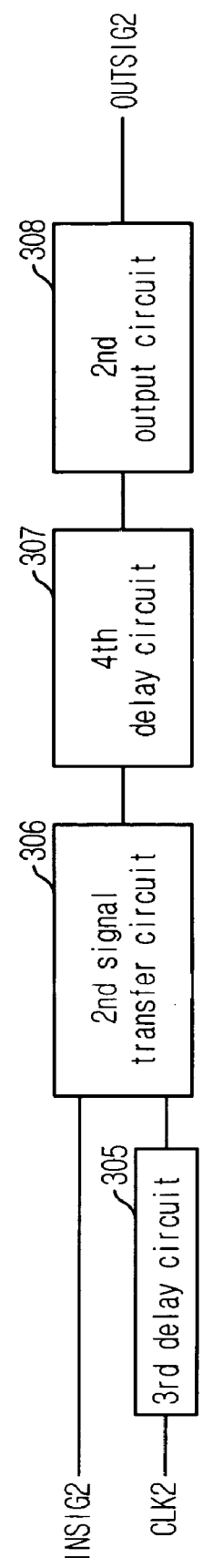

FIGS. 3a and 3b are block diagrams illustrating a signal generating circuit for obtaining a margin of setup/hold time according to an embodiment of the present invention. First, referring to FIG. 3a, the signal generating circuit to obtain the setup/hold time margin according to the present invention includes first and second delay circuits 301 and 303, a first signal transfer circuit 302 and a first output circuit 304. The first delay circuit 301 delays a clock signal CLK1 to obtain the setup/hold time margin of an input signal INSIG1. The first signal transfer circuit 302 transfers the input signal INSIG1 in synchronization with the delayed clock signal and the second delay circuit 303 delays an output signal from the first signal transfer circuit 302. The first output circuit 304 combines the input signal INSIG1 and an output signal of the second delay circuit 303 and outputs the combined signal.

At this time, an amount of the delay in the second delay circuit 303 may be preferably determined in such a manner that a rising edge of an output signal OUTSIG1 of the first output circuit 304 has a period of the clock signal CLK1. The second delay circuit 303 compensates for the additional delay which is caused by the first delay circuit 301. The first signal transfer circuit 302 has at least two flip-flop circuits and the first output circuit 304 is composed of a NAND gate receiving the input signal INSIG and the output signal of the second delay circuit 303.

Another signal generating circuit to obtain the setup/hold time margin according to the present invention is shown in FIG. 3b. The signal generating circuit of FIG. 3b includes third and fourth delay circuits 305 and 307, a second signal transfer circuit 306 and a second output circuit 308. The third delay circuit 305 delays a clock signal CLK2 to obtain the setup/hold time margin of an input signal INSIG2. The signal transfer circuit 306 transfers the input signal INSIG2 in synchronization with the delayed clock signal and the fourth delay circuit 307 delays an output signal from the second signal transfer circuit 306. The second output circuit 308 inverts an output signal of the fourth delay circuit 307 and outputs the inverted signal. The first signal transfer circuit 302 has at least two flip-flop circuits and the fourth delay circuit 307 compensates for the additional delay which is caused by the third delay circuit 305.

Here, the present invention delays the clock signals CLK1 and CLK2 during a predetermined time in order to amend the delay time difference (dt) which is greater than the period of time (tck) of the clock signals CLK1 and CLK2 (considering the setup/hold time margin of the clock signals CLK1 and CLK2) according to the high frequency environment of the semiconductor memory device.

Figure 4:
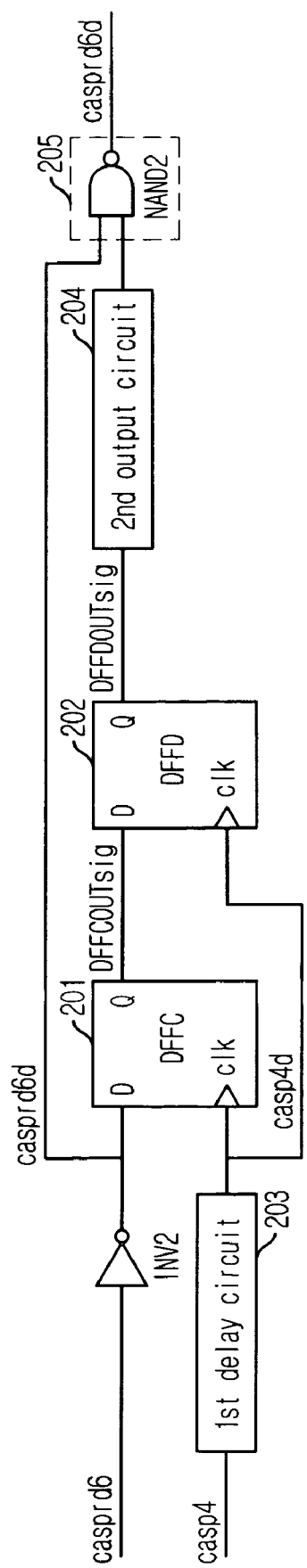
FIG. 4 is a block diagram illustrating an internal read signal generating circuit for burst length <8> according to an embodiment of the present invention.

FIG. 4 is a block diagram illustrating an internal read signal generating circuit for burst length <8> according to an embodiment of the present invention and the signal generating circuit of FIG. 3 is adapted to the internal read signal generating circuit of FIG. 4. Referring to FIG. 4, the internal read signal generating circuit for burst length <8> includes a second inverter INV2 to invert a read CAS source signal casprd6, a first delay circuit 203 to delay a CAS clock signal casp4, a first flip-flop circuit (DFFC) 201 to transfer the inverted read CAS source signal casprd6b in response to a delayed CAS clock signal casp4d, a second flip-flop circuit (DFFD) 202 to transfer an output signal DFFCOUTsig of the first flip-flop circuit (DFFC) 201 in response to the delayed CAS signal casp4d, a second delay circuit 203 to delay the output signal DFFDOUTsig of the second flip-flop circuit (DFFD) 202 and an output unit 205 to receive an output signal of a second delay circuit 204 and the inverted read CAS source signal casprd6b. At this time, the output unit 205 is composed of a NAND gate NAND2 and the second delay circuit 204 compensates for the additional delay which is caused by the first delay circuit 203.

In the present invention, the internal read signal generating circuit delays the clock signal during a predetermined time in order to amend the delay time difference (dt) which is greater than the period of time (tck) of the clock signal clk according to the high frequency environment of the semiconductor memory device. The meaning that the delay time difference (dt) is greater than the period of time (tck) of the clock signal clk is to obtain the setup/hold time margin of the inverted read CAS signal casprd6b. The delay time difference (dt) is greater than the period of time (tck) of the clock signal clk in the present invention; however the delay time difference (dt) can be shorter than the one period of time of the clock signal clk in consideration of the setup/hold time margin.

As a result, if the CAS clock signal casp4 is delayed during a predetermined time, the delay time difference (dt) is decreased and the output signal DFFCOUTsig is activated at the rising edge (r1') of the delayed CAS signal casp4d, thereby solving the problem mentioned above.

Figure 5:
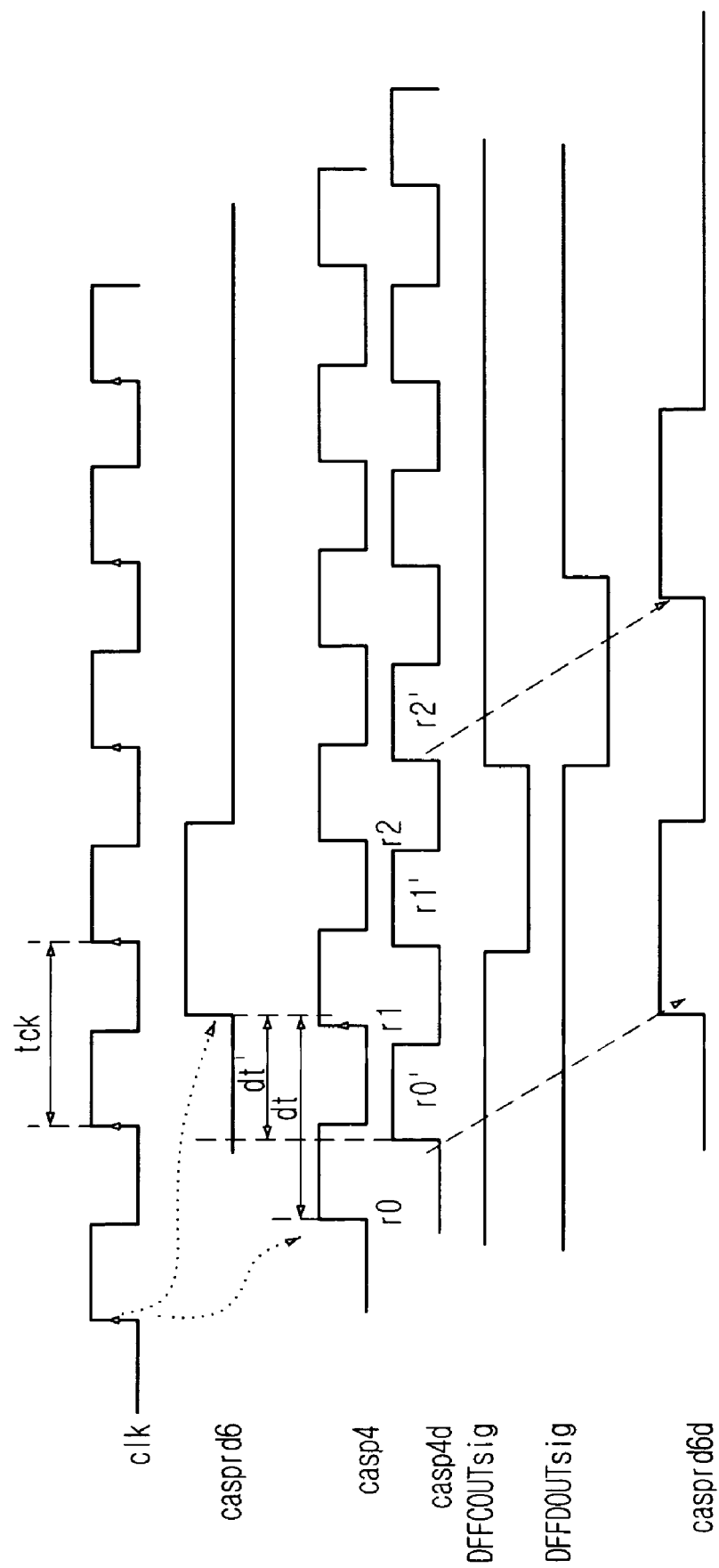
FIG. 5 is a timing diagram of the internal read signal generating circuit of FIG. 4.

FIG. 5 is a timing diagram of the internal read signal generating circuit of FIG. 4. Referring to FIG. 5, the delay time difference(dt) may be greater than the period of time (tck) of the clock signal clk according to the high frequency environment of the semiconductor memory device. In this case, when the CAS signal casp4 is delayed, the time difference(dt) between the rising edge of the delayed CAS clock signal casp4d and the read CAS source signal casprd6 is reduced more than one period of the clock signal clk. Accordingly, normal output signals DFFCOUTsig and DFFDOUTsig can be obtained and the desired internal read signal casprd6d can be produced.

The problem of the abnormal internal read signal casprd6d for the burst length <8>, which is caused by the time difference(dt) that is greater than the period of time (tck) of the clock signal clk according to the high frequency environment of the semiconductor memory device (considering the setup/hold time margin of the inverted read CAS source signal casprd6b, is solved in the present invention by delaying the time difference(dt) and making the time difference(dt) be shorter than or the same as the one period of time (tck) of the clock signal clk.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a first delay means for delaying a clock signal in order to obtain a margin of a setup/hold time of an input signal;
   a signal transfer means for transferring the input signal in synchronization with the delayed clock signal of the first delay means;
   a second delay means for delaying an output signal of the signal transfer means; and
   an output means for combining the input signal and an output signal of the second delay means, wherein an amount of the delay of the second delay means is determined in order that an output signal of the output means has a period corresponding to that of the clock signal.

2. The semiconductor memory device in accordance with claim 1, wherein the signal transfer means has at least two flip-flop circuits.

3. The semiconductor memory device in accordance with claim 1, wherein the output means is a first NAND gate receiving the input signal and the output signal of the second delay means.

4. An apparatus for generating an internal read signal comprising:
   a first delay means for delaying an internal clock signal in order to obtain a margin of a setup/hold time of an internal read signal;
   a flip-flop unit to transfer an input source signal for generating the internal read signal in synchronization with the delayed clock signal of the first delay means;
   a second delay means for delaying an output signal of the flip-flop unit; and
   an output means for combining the input source signal and an output signal of the second delay means, wherein an amount of delay of the second delay means is determined in order that the internal read signal has a period corresponding to that of the internal clock signal.

5. The apparatus in accordance with claim 4, wherein the flip-flop unit has at least two flip-flop circuits.

6. The apparatus in accordance with claim 4, wherein the output means is a NAND gate receiving the input source signal and an output signal of the second delay means 7. A semiconductor memory device comprising:
   a first delay means for delaying a clock signal in order to obtain a margin of a setup/hold time of an input signal;
   a signal transfer means for transferring the input signal in synchronization with the delayed clock signal of the first delay means; and
   a second delay means for delaying an output signal of the signal transfer means to compensate for additional delay caused by the first delay means.

8. The semiconductor memory device in accordance with claim 7, further comprising an output means for receiving an output signal of the second delay means and for outputting an internal read signal.

9. The semiconductor memory device in accordance with claim 7, wherein the signal transfer means has at least two flip-flop circuits.

* * * * *